United States Patent
Froger et al.

(10) Patent No.: US 7,726,578 B2
(45) Date of Patent: Jun. 1, 2010

(54) PROGRESSIVE UNPLUGGING MULTI-CARDS BODY

(75) Inventors: Alexis Froger, Meudon Cedex (FR); Denis Groeninck, Meudon Cedex (FR); Alain Le Loc'h, Versailles (FR); Dorothée Nerot, Orleans (FR); Yves Reignoux, Meudon Cedex (FR); Francois Roussel, Meudon Cedex (FR); Stéphane Provost, Sandillon (FR)

(73) Assignee: Axalto SA, Meudon Cedex (FR)

( * ) Notice: Subject to any disclaimer, the term of this patent is extended or adjusted under 35 U.S.C. 154(b) by 376 days.

(21) Appl. No.: 11/659,627

(22) PCT Filed: Aug. 8, 2005

(86) PCT No.: PCT/IB2005/002377

§ 371 (c)(1),
(2), (4) Date: Feb. 7, 2007

(87) PCT Pub. No.: WO2006/016257

PCT Pub. Date: Feb. 16, 2006

(65) Prior Publication Data

US 2007/0270039 A1 Nov. 22, 2007
US 2008/0233804 A2 Sep. 25, 2008

(30) Foreign Application Priority Data

Aug. 10, 2004 (EP) .................................. 04292028
Oct. 18, 2004 (EP) .................................. 04292478

(51) Int. Cl.
*G06K 19/06* (2006.01)
(52) U.S. Cl. ...................... 235/492; 235/487; 235/380
(58) Field of Classification Search ................. 235/492
See application file for complete search history.

(56) References Cited

U.S. PATENT DOCUMENTS 6,561,432 B1 * 5/2003 Vedder et al. ............... 235/492

(Continued)

FOREIGN PATENT DOCUMENTS

DE 199 06 570 8/2000
WO WO-03/100720 12/2003

OTHER PUBLICATIONS

International Search Report for PCT/IB2005/002377 mailed Nov. 14, 2005 (2 pages).

*Primary Examiner*—Seung H Lee
*Assistant Examiner*—Christle I Marshall
(74) *Attorney, Agent, or Firm*—Osha • Liang LLP

(57) ABSTRACT

A card body comprises a first card body (ID-1 card 1), a second card body (plug-in card 2) and a third card body (mini card 3). The first card body has a first shape (ID-1 shape). The second card body comprises a second shape (plug-in shape). The first card body encompasses the second card body. The third card body comprises a third shape (mini shape). The second card body encompasses the third card body. The third card body has a cavity for receiving an electronic module. A first boundary separates the first shape (ID-1 shape) from the second shape (plug-in shape), and comprises a first number of apertures (5, 6, 7, 17, 18) and a first number of notches (19 and 20) defining a first mechanical inter-card body coupling strength (link between ID-1 card 1 and plug-in card 2). A second boundary separates the second shape (plug-in shape) from the third shape (mini shape), and comprises a second number of apertures (21) and a second number of notches (11, 12, 13, 14, 15, 16) defining a second mechanical inter-card body coupling strength (link between plug-in to card 2 and mini card 3). A cumulated length of the first number of apertures (5, 6, 7, 17, 18) is greater than a cumulated length of the second number of apertures (21) and a cumulated length of the first number of notches (19 and 20) is lesser than a cumulated length of the second number of notches (11, 12, 13, 14, 15, 16) so that the second mechanical coupling strength is greater than the first mechanical coupling strength.

11 Claims, 3 Drawing Sheets

U.S. PATENT DOCUMENTS

| | | | |
|---|---|---|---|
| 6,722,571 B1 * | 4/2004 | Lavrut et al. | 235/492 |
| 6,964,377 B1 * | 11/2005 | Haghiri et al. | 235/492 |
| 2004/0223305 A1 * | 11/2004 | Amiot et al. | 257/679 |
| 2005/0231921 A1 * | 10/2005 | Noda et al. | 235/492 |
| 2008/0251587 A1 * | 10/2008 | Martinent et al. | 235/492 |

* cited by examiner

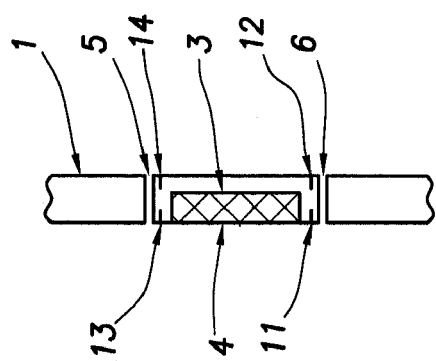
FIG.1.B
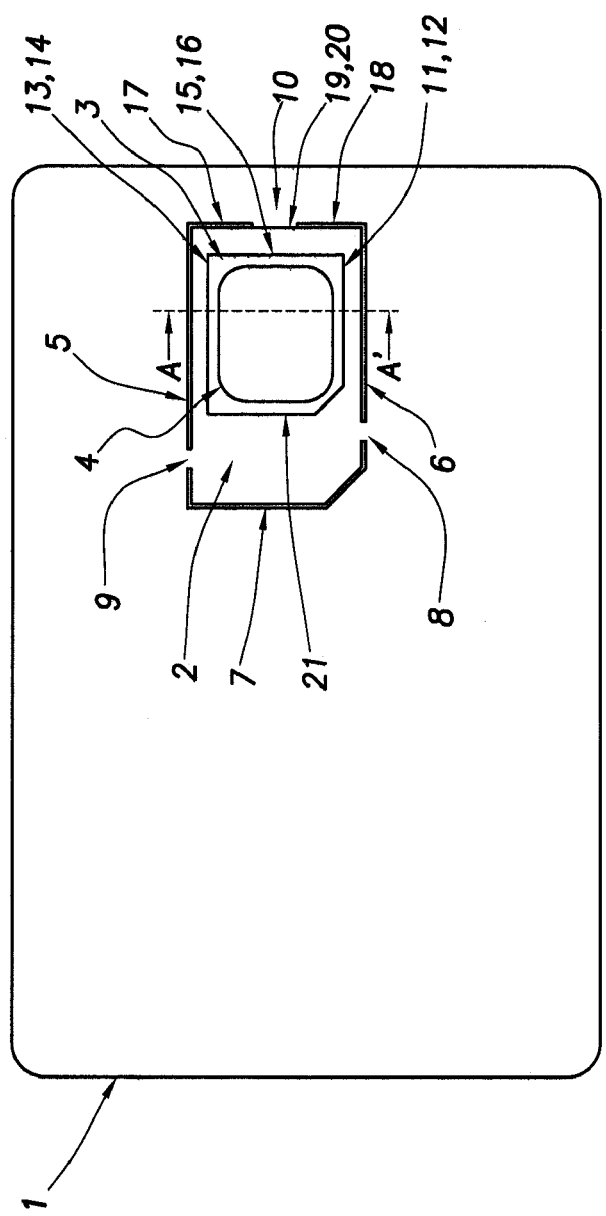
FIG.1.A

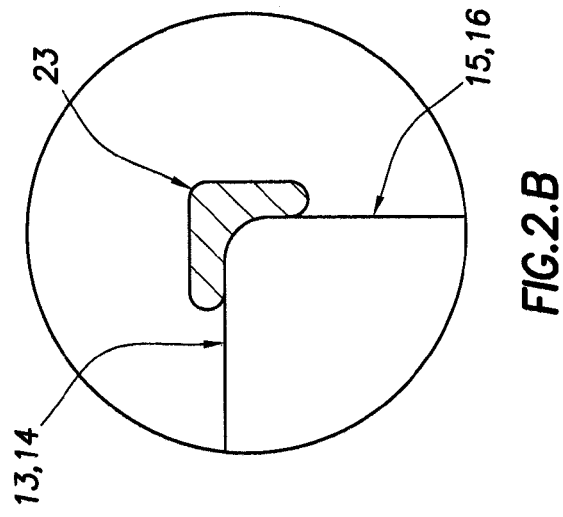
FIG.2.B
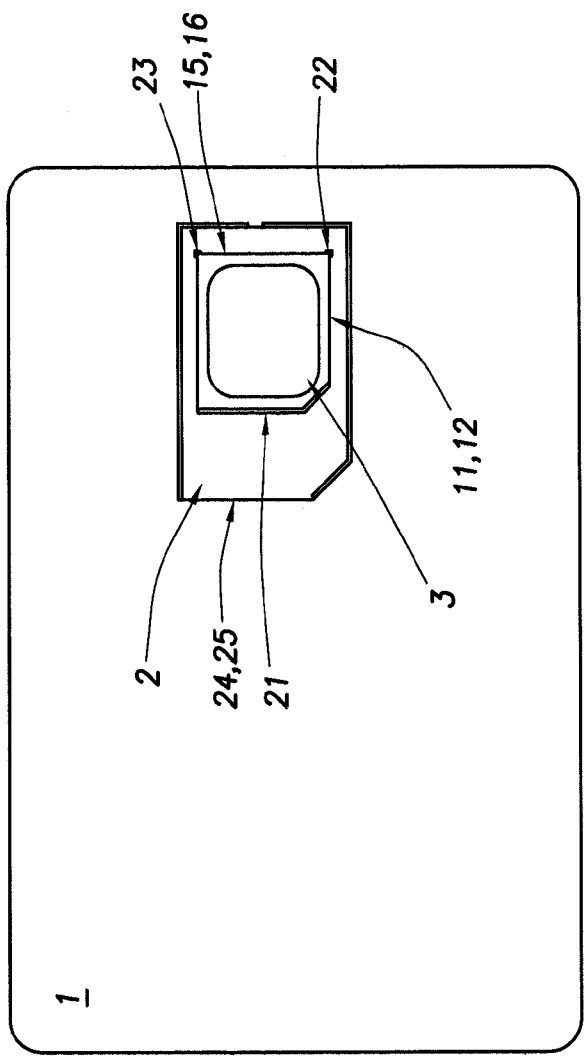
FIG.2.A

PROGRESSIVE UNPLUGGING MULTI-CARDS BODY

FIELD OF THE INVENTION

The invention relates to a card body comprising multiple formats of cards, in particular each card corresponding to a different standard, and the corresponding manufacturing method.

The invention also relates to a method of unplugging a card body comprising multiple formats of cards.

BACKGROUND OF THE INVENTION

Smart cards are electronic portable devices comprising an electronic module embedded in a plastic card body. The electronic module comprises an integrated circuit and contacts (also known as contact area) for connection to an electronic device (e.g. a terminal like a mobile telephone).

Smart cards known as Subscriber Identification Modules or SIM cards are inserted in mobile telephones in order for the mobile telephone users to gain access to the different services offered on the mobile telecommunication networks by the mobile telecommunication operators.

Typically, a SIM card has a standardized format of 25×15 mm defined in ETSI standard GSM 11.11 "Specification of the Subscriber Identity Module—Mobile Equipment (SIM-ME) interface". Such a SIM card is also known as "plug-in" card because the mobile telephone user plugs the SIM card in a specific cavity of the mobile phone.

Usually, plug-in cards are manufactured on manufacturing equipment handling smart cards having a standardized format of 85.6×54 mm defined in ISO standard 7810. Such an ISO standard compliant card is also known as an "ID-1" card. The manufacturing process comprises a first step during which an ID-1 card is manufactured and a second step during which appropriate cavities and partial pre-cut shapes are made on the ID-1 card so as to define the plug-in card. Thus, cards are manufactured in such a way that they respect both ID-1 card format (as far as the plug-in card is not removed) and plug-in card format (as soon as the plug-in card is removed from ID-1 card).

The cards manufacturer delivers cards having the ID-1 card format. The cavities and partial pre-cut shapes allow a mobile telephone user to handily remove the plug-in card from the ID-1 card in order to insert it in the mobile telephone.

Now, a third type of card having a standardized format of 15×12 mm is defined by ETSI standard TS102221 "Smart cards; UICC interface; Physical and logical characteristics", Such an ETSI standard compliant card is also known as a "mini" card. The mini cards are also manufactured according to a similar manufacturing process on the same manufacturing equipment as the ID-1 card and the plug-in card as described hereinbefore.

Consequently, for mobile telecommunication application, smart cards can have 3 different form factors or shapes: "ID-1", "plug-in" and "mini". The mini card format is included inside the plug-in card format. The plug-in card format is included inside the ID-1 card formal.

Usually the cavities are performed on the card body thanks to appropriate molding or to mechanical punching combining die and matrix. The card manufacturing process with 3 different form factors on a same card body is difficult to implement due to the proximity of the limit of the plug-in card and the limit of the mini card. In particular, the manufacturing equipments (e.g. tools) are difficult to design and to manufacture. This situation leads to an increase of the manufacturing costs.

Normally, the plug-in card should be detached or separated from the ID-1 card, and subsequently the mini card should be detached or separated from the plug-in card. Now, according to the current manufacturing method as described hereinbefore, the structure of card delivered to a mobile telephone user is a ID-1 card format with the plug-in card and mini card delimited on it through appropriate cavities and partial pre-cut shapes. A mobile telephone user could unwillingly or mistakenly separate the mini card directly from the ID-1 card. As this operation is irreversible, he will not be able to insert the card anymore in a mobile telephone compliant with the plug-in card format.

SUMMARY OF THE INVENTION

One goal of the invention is to propose a card body and a corresponding manufacturing method that overcome at least one of the above mentioned shortcomings of the prior art.

According to the invention, a gradation of the force required for separating the different formats of cards (difficulty) is obtained by combining some apertures and some partial cut for defining the boundaries of the different card body shapes on the ID-1 card body.

Preferably, apertures are selected for delimiting the plug-in card while partial blade cuts are selected for delimiting the mini card. More precisely, the boundary around the plug-in card comprises a majority of apertures while the boundary around the mini card comprises a majority of blade cuts (notches). Thus, the separation of the plug-in card from the ID-1 card is mechanically easier than the separation of the mini card from the plug-in card.

The card combining the 3 different formats of cards has a structure enabling the plug-in card to be removed in an easier way than the mini card. Thus, a mobile telephone user desiring to use the plug-in card will remove it easily from the ID-1 card. Moreover, a mobile telephone user wishing to use the mini card will firstly remove the plug-in card from the ID-1 card (easily), and subsequently remove the mini card from the plug-in card (more difficult). This gradation of the force to be exercised by the mobile telephone user to separate the different cards (gradation of difficulties) prevents unplugging them in the wrong order. Consequently, the risk that a mobile telephone user removes by mistake the mini card from the ID-1 card is avoided, at least greatly reduced.

According to the manufacturing method of the invention, the apertures and notches are performed in two distinct steps with the same manufacturing equipment as the one used for manufacturing prior art cards.

As, on the one hand notches are preferably delimiting the mini card while apertures are preferably delimiting the plug-in card in the zone where the boundary of the plug-in card is close to the boundary of the mini card, and on the other hand notches and apertures are performed in two distinct manufacturing steps, the tools (punching tools) used for these manufacturing equipments are easy to design and manufacture.

Thus, the manufacturing method of the invention does not incur any additional cost for its implementation.

BRIEF DESCRIPTION OF THE DRAWINGS

The present invention is illustrated by way of example and not limited to the accompanying figures, in which like references indicate similar elements:

FIG. 1.A schematically shows a backside view of a card body according to a first embodiment of the invention;

FIG. 1.B shows a cross-section view along the line A-A' of FIG. 1.A;

FIG. 2.A schematically shows a backside view of a card body according to a second embodiment of the invention;

FIG. 2.B shows a detailed part of the card body according to FIG. 2.A;

DETAILED DESCRIPTION OF THE INVENTION

Figure 3:
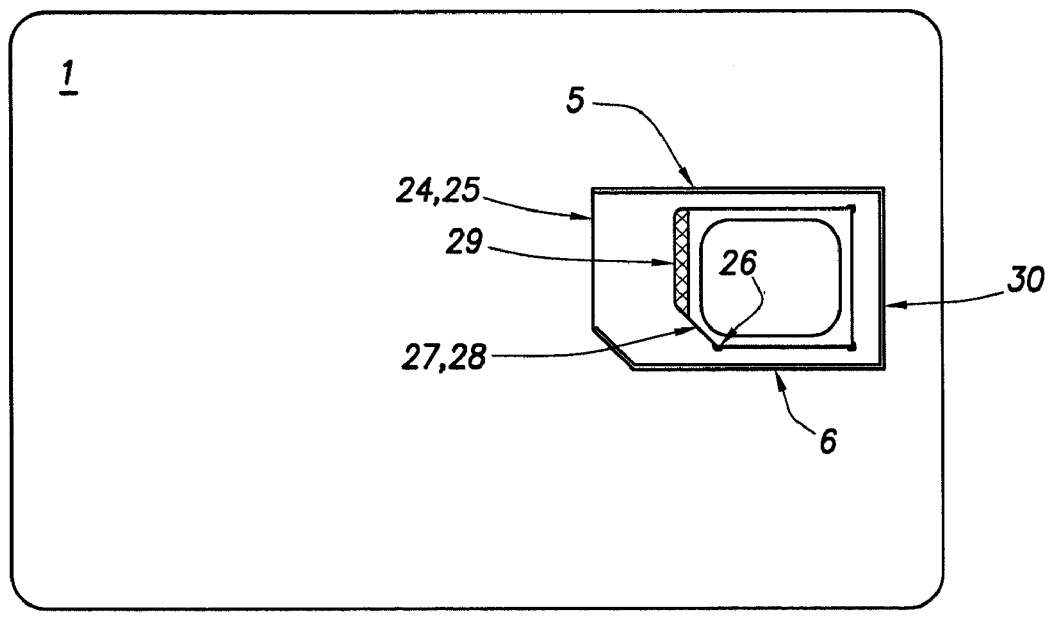
FIG. 3 schematically shows a backside view of a card body according to a third embodiment of the invention.

In the following detailed description and for the purpose of the present invention, the terminology smart card, card and card body are considered to be equivalent terminology.

FIG. 1.A shows a back-side view of a card body according to a first embodiment of the invention. The card body comprises an ID-1 card 1, a plug-in card 2 and a mini card 3 of substantially parallelepipedic shapes.

The electronic module limit 4 is shown by dotted line. It comprises, at least one integrated circuit and a contact area on the other side of the card, for connecting to a terminal. The electronic module is well known by the man skilled in the art and will not be further described.

One edge at the corner of the plug-in card 2 and a mini card 3 is cut off at 45° so as to form a means of fool proofing for its appropriate positioning when inserted in a mobile telephone.

A first combination of a first number of apertures 5, 7, 6, 18 and 17, and a first number of notches 19 and 20 defines the size and boundary of the plug-in card 2. A second combination of a second number of apertures 21 and a second number of notches 11, 12, 13, 14, 15 and 16 defines the size and boundary of the mini card 3. The number of apertures and notches is chosen so that there is a majority of apertures around the plug-in card 2 and majority of notches around the mini card 3. The apertures 5, 6, 7, 17, 18 and 21 can be obtained by molding or by mechanical punching of the card body. The notches 11, 12, 13, 14, 15, 16, 19 and 20 are obtained by mechanical cuttings (e.g. by blades) that do not cross entirely the card body.

Between two consecutive apertures 5, 7, 6, 18 and 17, there are respectively tabs 8, 9 and 10. The tabs form a link between each card body that defines a mechanical coupling strength, avoiding accidental separation of the different card bodies during and after the manufacturing process. Alternatively, some of the tabs could also have some notches 19 and 20. A notch can be made on one side or on both sides of the tab.

FIG. 1.B shows a cross section along the line A-A' of FIG. 1.A. The boundary of the plug-in card 2 is defined by the apertures 5 and 6. The boundary of the mini card 3 is defined by the notches 11 and 13 on one side and the notches 12 and 14 on the other side.

Thus, the separation of plug-in card 2 from ID-1 card 1 is easy as it is linked to it only by the tabs 8, 9 and 10 (first mechanical inter-card body coupling strength) while the separation of the mini card 3 from plug-in card 2 is more difficult because of the presence of the notches (second mechanical inter-card body coupling strength greater than the first one).

FIG. 2.A shows a back-side view of a card body according to a second embodiment of the invention. The card body comprises an ID-1 card 1, a plug-in card 2 and a mini card 3.

According to the second embodiment, two additional apertures 22 and 23 are made in the corners of the mini card 3. These apertures create a clear separation between notches 11 and 12 and notches 15 and 16, and between notches 13 and 14 and notches 15 and 16. This reduces the tearing of material during unplugging operation and allows getting a mini card that is cleaner in the corner once unplugged.

FIG. 2.B shows a magnified detail of the card body according to FIG. 2.A, and in particular of the additional aperture 23 between notches 13, 14 and 15, 16 respectively.

The second embodiment also shows a possible alternative wherein the tabs 8 and 9 (see FIG. 1.A) are replaced by notches 24 and 25. This is only an example as there numerous possibilities regarding the tabs number, sizes and locations.

FIG. 3 shows a back-side view of a card body according to a third embodiment of the invention.

According to this embodiment, a third corner aperture 26 separates notches 11 and 12 from notches 27 and 28. The notches 27 and 28 are provided on the edge at the corner of the mini card 3 cut off at 45°.

The third embodiment also shows a possible alternative wherein the tab 10 (see FIG. 1.A) is suppressed, the apertures 17 and 18 being made continuous by a unique aperture 30. Thus, only one link still exists between the plug-in card 2 and the ID-1 card 1. This link is cut by notches 24 and 25. In this last example the plug-in card can be very easily separated from ID-1 card by alternate folding.

Finally, the third embodiment also shows a possible variant consisting in replacing the aperture 21 by a larger aperture 29. The larger aperture 29 allows in particular a mobile telephone user to introduce its nail for voluntary and easily separating the mini card 3 from the plug-in card 2.

The third embodiment has the additional advantage of allowing replacing a mini card 3 into a plug-in card 2 once separated for fitting in a plug-in card type compliant mobile telephone. In effect, The boundary of the mini card 3 comprises a majority of notches, in particular at least one notch 13, 14, 15, 16, 27, 28 on each side of the parallelepiped enabling a good holding of the mini card into the plug-in card.

In the examples presented hereinbefore, notches were matching on each of the card body sides (see FIG. 1.B). However, there are numerous possibilities regarding the notches number, sizes and locations. It is understood that notches can be placed at different locations on the different boundaries. For example, it is possible to provide notches on one side of the card that do not match exactly on the other side, to provide notches only on one side of the card, etc. . . .

Using the hereinbefore described embodiments, the mobile telephone user will naturally unplug in priority the plug-in card from the ID-1 card rather than the mini card. Subsequently, the mobile telephone user will decide to go on with the process of unplugging the mini card from the plug-in card. The gradation of unplugging force to be exercised prevents the user of directly unplugging the mini card from the ID-1 card.

In order to manufacture the cards described hereinbefore, the manufacturing method of the invention is using known manufacturing equipment, i.e. the one used for manufacturing prior art cards.

The punching of the different apertures and notches forming the different cards boundaries are performed in several steps. In the examples shown above, the notches 13 and 14 are very close to the aperture 5, and notches 11 and 12 are very close to the aperture 6. Advantageously, these apertures and notches are manufactured in two distinct steps with a two-steps punching equipment. During a first step all the apertures are performed. During a second step, all the notches are performed. Obviously, the first and second steps order can be inversed.

The notches which are partial pre-cut are usually performed mechanically using blades. These blades can generate notches on both sides of the card body without crossing it completely or on one side only.

The apertures can be obtained by molding or mechanical die/matrix punch. It is possible to manufacture some of the apertures by molding and some by mechanical punching or all the apertures using the same technique.

Using the manufacturing method of the invention is advantageous because, in addition to the fact that usual manufacturing equipments can be used, the design and manufacturing of the tools used for these manufacturing equipments is easy and cost effective.

CONCLUDING REMARKS

The detailed description hereinbefore with reference to the drawings illustrates the following characteristics. A card body comprises a first card body (ID-1 card 1), a second card body (plug-in card 2) and a third card body (mini card 3).

The first card body has a first shape (ID-1 shape).

The second card body comprises a second shape (plug-in shape). The first card body encompasses the second card body.

The third card body comprises a third shape (mini shape). The second card body encompasses the third card body. The third card body has a cavity for receiving an electronic module.

A first boundary separates the first shape (ID-1 shape) from the second shape (plug-in shape), and comprises a first number of apertures (apertures 5, 6, 7, 17, 18) and a first number of notches (notches 19 and 20) defining a first mechanical inter-card body coupling strength (link between ID-1 card 1 and plug-in card 2).

A second boundary separates the second shape (plug-in shape) from the third shape (mini shape), and comprises a second number of apertures (aperture 21) and a second number of notches (notches 11, 12, 13, 14, 15, 16) defining a second mechanical inter-card body coupling strength (link between plug-in card 2 and mini card 3).

A cumulated length of the first number of apertures (apertures 5, 6, 7, 17, 18) is greater than a cumulated length of the second number of apertures (aperture 21) and a cumulated length of the first number of notches (notches 19 and 20) is lesser than a cumulated length of the second number of notches (notches 11, 12, 13, 14, 15, 16) so that the second mechanical coupling strength (link between plug-in card 2 and mini card 3) is greater than the first mechanical coupling strength (link between ID-1 card 1 and plug-in card 2).

Figure 4:
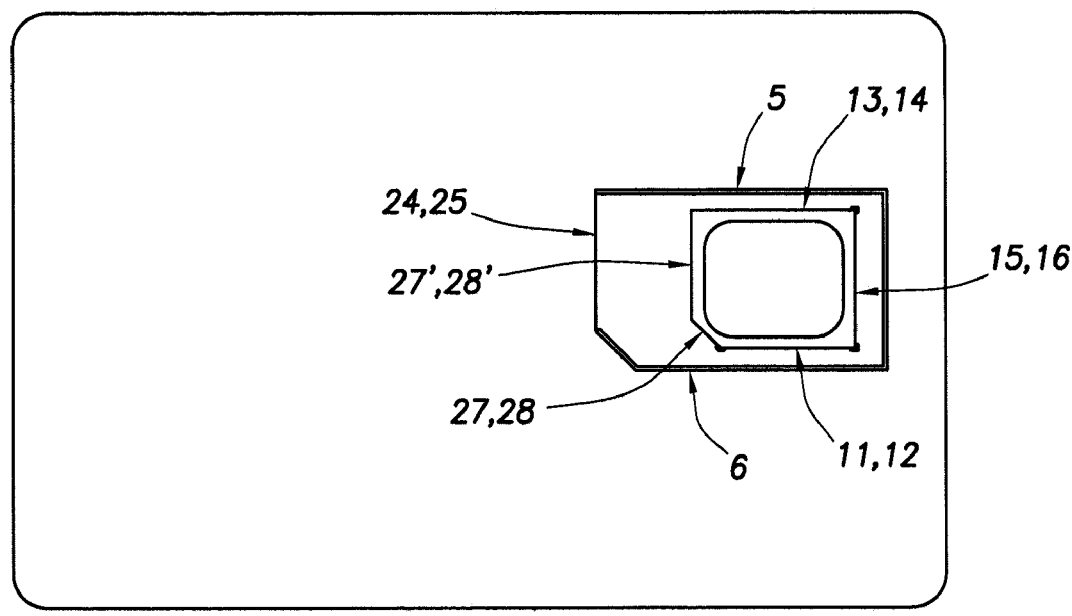
FIG. 4 schematically shows a backside view of a card body according to a fourth embodiment of the invention.

Advantageously, as illustrated in FIG. 4, the second number of apertures is zero. The larger aperture 29 (see FIG. 3) is replaced by notches 27' and 28'. The corner apertures 22 (see FIG. 2A), 23 (see FIG. 2A) and 26 (see FIG. 3) are removed, in this configuration the card body shows good mechanical properties, which complies with the mechanical tests as defined by the ISO 7816-1 standard. The evaluation results are shown in Table 1.

TABLE 1

|  | ABS moulded card h(**) = 0.25 mm | (2*PET 152 μm + 1*PET g 520 μm) card h(**) = 0.25 mm | (2*PET 152 μm + 1*PET g 520 μm) card h(**) = 0.30 mm | (2*PET 152 μm + 1*PET g 520 μm) card h(**) = 0.35 mm |
|---|---|---|---|---|
| Bending characteristics(*) | 1000 times or more | 1000 times or more | 1000 times or more | 1000 times or more |

(*) Bending characteristics: experimented by bending 10 cards in the shorter direction and in the longer direction.
Longer direction: flexibility (f): 20 mm, periodicity: bending for 30 times/min
Shorter direction: flexibility (f): 10 mm, periodicity: bending for 30 times/min
(**) h: Precut depth of the notches on each side of the card in millimeters.

The detailed description hereinbefore further illustrates the following optional characteristics.

The first boundary comprises at least one tab (tabs 8, 9 and 10).

The first, second and third shapes are substantially parallelepipedic shapes.

The second boundary comprises at least one corner provided with an additional aperture (apertures 22, 23 and 26).

At least one of the apertures has a size enabling a user to introduce a nail (aperture 29).

The first card body (ID-1 card 1) has a size of approximately 85,6×54 mm according to ISO standard 7810.

The second card body (plug-in card 2) has a size of approximately 25×15 mm according to ETSI standard GSM 11.11.

The third card body (mini card 3) has a size of approximately 15×12 mm according to ETSI standard TS102221.

The detailed description hereinbefore further illustrates the following card body manufacturing method. This method comprises a first manufacturing step consisting in manufacturing a first card body, and a second manufacturing step consisting in manufacturing a second and third card body.

During the first manufacturing step, a first card body (ID-1 card 1) having a first shape and a cavity for receiving an electronic module is manufactured.

During the second manufacturing step, second (plug-in card 2) and third (mini card 3) card bodies are manufactured. The second card body has a second shape, being separated by a first boundary from the first shape. The first card body encompasses the second card body. The third card body has a third shape, being separated by a second boundary from the second shape. The second card body encompasses the third card body.

The electronic module can be embedded in the cavity before of after this second manufacturing step.

More precisely, the second manufacturing step comprises two punching steps.

A first punching step consists in punching a first number of apertures and a second number of apertures, the cumulated length of the first number of apertures being greater than the cumulated length of the second number of apertures.

A second punching step consists in punching a first number of notches and a second number of notches, the cumulated length of the first number of notches being lesser than the cumulated length of the second number of notches.

Optionally, the first punching step and second punching step can be inversed.

The detailed description hereinbefore also illustrates the following card body unplugging method. The method comprises two steps.

During a first step, a first force (unplugging force) greater than the first mechanical inter-card body coupling strength (link between ID-1 card 1 and plug-in card 2) is exercised on an area constituted by the second and third card body relatively to the first card body so as to separate the second and third card body (plug-in card 2 and mini card 3) from the first card body (ID-1 card 1).

During a second step, a second force (unplugging force) greater than the second mechanical inter-card body coupling strength (link between plug-in card 2 and mini card 3) is exercised on the third card body (mini card 3) relatively to the second card body (plug-in card 2) so as to separate the third card body from the second card body.

The second force to be exercised is greater than the first force.

The detailed description hereinbefore illustrates particular example in the field of mobile telecommunication (specific card sizes according to specific standards). However, the invention is not limited to this particular application and can be adapted to others applications wherein different formats of cards are involved (payment application, transport application, security application, etc. . . . ).

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

What is claimed is:

1. A card body comprising:
    a first card body having a first shape with a first perimeter comprising a first plurality of sides,
    a second card body having a second shape with a second perimeter comprising a second plurality of sides, the first card body encompassing the second card body,
    a first boundary separating the first shape from the second shape, the first boundary comprising a first number of apertures and a first number of notches defining a first mechanical inter-card body coupling strength,
    a third card body having a third shape with a third perimeter comprising a third plurality of sides, the second card body encompassing the third card body, the third card body having a cavity for receiving an electronic module,
    a second boundary separating the second shape from the third shape, the second boundary comprising a second number of apertures and a second number of notches defining a second mechanical inter-card body coupling strength,
    wherein a cumulated length of the first number of apertures is greater than a cumulated length of the second number of apertures and a cumulated length of the first number of notches is less than a cumulated length of the second number of notches such that the second mechanical coupling strength is greater than the first mechanical coupling strength, and
    wherein none of the second plurality of sides of the second perimeter share a common side with any of the first plurality of sides of the first perimeter, and wherein none of the third plurality of sides of the third perimeter share a common side with any of the second plurality of sides of the second perimeter.

2. The card body of claim 1, wherein at least one of the first and second boundary comprises a tab.

3. The card body of claim 1, wherein the first, second and third shapes are substantially parallelepipedic shapes.

4. The card body of claim 1, wherein the second boundary comprises at least one corner provided with an additional aperture.

5. The card body of claim 1, wherein at least one of the first number of apertures has a size enabling a user to introduce a nail.

6. The card body of claim 1, wherein the first card body has a size of approximately 85.6×54 mm according to ISO standard 7810.

7. The card body of claim 1, wherein the second card body has a size of approximately 25×15 mm according to ETSI standard GSM 11.11.

8. The card body of claim 1, wherein the third card body has a size of approximately 15×12 mm according to ETSI standard TS102221.

9. A card body manufacturing method comprising the following steps:
    a first manufacturing step comprising manufacturing a first card body having a first shape with a first perimeter comprising a first plurality of sides, and a cavity for receiving an electronic module,
    a second manufacturing step comprising manufacturing:
        a second card body having a second shape with a second perimeter comprising a second plurality of sides, the first card body encompassing the second card body, and the first shape and the second shape being separated by a first boundary,
        a third card body having a third shape with a third perimeter comprising a third plurality of sides, the second card body encompassing the third card body, and the second shape and the third shape being separated by a second boundary,
        wherein none of the second plurality of sides of the second perimeter share a common side with any of the first plurality of sides of the first perimeter, and wherein none of the third plurality of sides of the third perimeter share a common side with any of the second plurality of sides of the second perimeter, and
    wherein the second manufacturing step comprises the further following steps:
        a first punching step consisting in punching a first number of apertures and a second number of apertures, a cumulated length of the first number of apertures being greater than a cumulated length of the second number of apertures, and
        a second punching step consisting in punching a first number of notches and a second number of notches, a cumulated length of the first number of notches being lesser than a cumulated length of the second number of notches.

10. The card body manufacturing method of claim 9, wherein the first punching step and second punching step are inversed.

11. A card body comprising:
    a first card body having a first shape with a first perimeter comprising a plurality of sides,
    a second card body having a second shape with a second perimeter comprising a plurality of sides, the first card body encompassing the second card body, the first card body coupled to the second card body, and a third card body having a third shape with a third perimeter comprising a plurality of sides, the second card body encompassing the third card body, the second card body coupled to the third card body, the third card body having a cavity for receiving an electronic module, wherein none of the plurality of sides of the second perimeter share a common side with any of the plurality of sides of the first perimeter, and wherein none of the plurality of sides of the third perimeter share a common side with any of the plurality of sides of the second perimeter.

* * * * *